United States Patent
Libby et al.

(10) Patent No.: US 8,525,837 B2
(45) Date of Patent: Sep. 3, 2013

(54) METHOD AND APPARATUS FOR DATA PREVIEW

(75) Inventors: Jonathan C. Libby, Gray, ME (US); Hitesh Patel, Pompton Lakes, NJ (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 1167 days.

(21) Appl. No.: 12/111,264

(22) Filed: Apr. 29, 2008

(65) Prior Publication Data
US 2009/0267947 A1 Oct. 29, 2009

(51) Int. Cl.
*G06T 11/20* (2006.01)

(52) U.S. Cl.
USPC ..................................... 345/440.1

(58) Field of Classification Search
CPC .... G01R 13/345; G01R 13/02; G01R 13/029; G09G 1/162
USPC ................. 345/440.1, 660, 667; 710/67, 68; 73/866.3
See application file for complete search history.

(56) References Cited

U.S. PATENT DOCUMENTS

| | | | | |
|---|---|---|---|---|
| 4,818,932 A | * | 4/1989 | Odenheimer | 345/440.1 |
| 5,517,105 A | * | 5/1996 | Holzwarth | 324/121 R |
| 6,229,536 B1 | * | 5/2001 | Alexander et al. | 345/440.1 |
| 2003/0107573 A1 | * | 6/2003 | Miller et al. | 345/440 |
| 2003/0107581 A1 | * | 6/2003 | Ritter et al. | 345/606 |
| 2004/0056874 A1 | * | 3/2004 | MacInnis et al. | 345/660 |
| 2007/0273694 A1 | * | 11/2007 | Dobyns et al. | 345/440.1 |

* cited by examiner

*Primary Examiner* — Jeffery A Brier
(74) *Attorney, Agent, or Firm* — Gordon Kessler

(57) ABSTRACT

A method and apparatus for displaying information on a device acquiring data is provided. The method includes the steps of receiving an input data, generating a version of the received input data to be displayed in accordance with one or more display parameters and displaying the generated version of the received input data. A requested change in one or more display parameters is received and the requested change of the one or more display parameters is implemented on the displayed data. Processing continues on the further received input data in accordance with the requested change in the one or more display parameters and the display is ultimately updated with the processed further received input data.

21 Claims, 2 Drawing Sheets

METHOD AND APPARATUS FOR DATA PREVIEW

BACKGROUND OF THE INVENTION

In a digital oscilloscope, a waveform trace is a fundamental software object that provides the user with a representative view of an acquired waveform data. Vertical and horizontal scale and offset controls affect the definition of the grid on which the waveform trace is displayed. The vertical (y) and horizontal (x) extents of the grid may be expressed as the waveform frame (in vertical and horizontal units of the waveform, e.g. Volts and Seconds) or in terms of display units (e.g. pixels).

In such a digital oscilloscope, a waveform trace renderer has the responsibility to process the waveform data to produce appropriate data, and place this data in a buffer so that the data is properly scaled to the display. This may be necessary because the digital oscilloscope typically acquires many more data points than are displayable on any type of oscilloscope display, or for other reasons. Thus, the data is most often decimated appropriately so that this decimated waveform representation can be displayed.

However, the inventor of the present invention has determined that as a user changes these scale and offset controls, it is desirable for the waveform trace to be updated relative to the modified controls to provide feedback for the user, and to display the waveform trace in a form corresponding to the new scale and offset as selected by the user. As waveform data sizes become large and/or as waveform analysis functions become complex (computationally intense), such updating becomes a more time-consuming endeavor. Indeed, it has been determined that it becomes more difficult to update the waveform data and the resulting waveform trace quickly enough in response to such control changes. As a result, this may result in the user having to wait for some period of time between different settings when changing those settings to see what the screen display will look like. This in turn may cause the system to feel sluggish, may result in the user having a more difficult and cumbersome task when moving the controls, and may result in a reduced accuracy of such movements by the user.

This result is primarily based upon the need to process a new incoming data stream each time new settings are selected. As is shown in FIG. 1, Controls 110 may comprise horizontal and vertical scale and offset controls, or other variable display settings. A waveform data producer 120 produces various waveform data and waveform frame information. This produced information, along with the horizontal and vertical scale and offset controls, is provided to a waveform trace renderer 130. Trace renderer 130 provides an input trace buffer that is updated based upon the received waveform data, and an output trace buffer for indicating the data that is to be drawn to a display. Employing a dual buffer design, once the information from the output buffer is written to the display and the information to the input buffer is updated, the identity of the input buffer and the output buffer are switched. Then, the information that was updated when acting as the input buffer becomes the output buffer and is written to the display. The prior output buffer is now the input buffer and receives further updated information as above. As is apparent, each time a horizontal and vertical scale and offset control is changed, the processing by the waveform trace renderer must be performed. Based upon the volume of data, or the complexity of the required processing operations, this processing may delay the display of data on the display, as noted above.

SUMMARY OF THE INVENTION

In accordance with the invention, a method and apparatus are provided for previewing data while allowing for an improved user experience when a data update is desirable. The invention provides a means of updating a waveform trace in order to take into account new scale and offset settings as a function of a previous waveform trace data. Because any waveform trace data size is a function of the display grid size (e.g. 1000 horizontal pixels), this preview update does not take a long time to process. Indeed, even if the source waveform data increases in size and/or the time to compute the source waveform data increases in time, the processing for updating the display to conform to the new scale and offset settings does not increase.

Furthermore, in accordance with the invention, by maintaining two waveform trace buffers, it is possible to perform the inventive preview update on the previous trace data concurrently with the "regular" processing of newly acquired incoming data, including any waveform trace update that depends on the full waveform data. This results in a responsive system where the preview waveform trace is displayed quickly in response to user changes to the scale, offset, or other settings that might result in an update of the displayed waveform data. The updated preview display is in turn eventually replaced by the fully accurate waveform trace when the "regular" update completes processing the next incoming acquired data, or waveform data otherwise stored, imported, generated from a simulation or any other source for waveform data.

Additionally, in accordance with the invention, through the use of operating system threading priorities, the preview update thread may be assigned a higher priority than the regular (full data) update thread causing it to complete more quickly whenever the user is making scaling or offset changes. If the user isn't making any changes, then the preview update thread remains idle and has no affect on the regular (full data) update performance.

This technique may be applied to any scenario wherein incoming data is being received and displayed, and where any settings might be changed, automatically, or by a user, that would normally result in a reprocessing of a large amount of information, thus slowing down the display of that updated information.

Therefore it is an object of the invention to provide a user with an improved method and apparatus for updating displayed information Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE INVENTION

The invention will now be described making reference to the drawings. Within a digital oscilloscope there may be a number of different types of waveform traces. The present invention may be applied to most, if not all, of them, with slight implementation variations depending on the specifics of the waveform type. Therefore, the processing in accordance with the invention is not limited to any particular type of waveform.

By way of example, and for illustrative purposes only, one waveform trace type may be produced by compacting received and acquired waveform data to a series of min/max vertical lines. Thus, in accordance with such a procedure, for example, if the acquired waveform data size is 1e6 samples and the waveform trace size to be displayed on the display is 1000 horizontal pixels, then each horizontal pixel location will preferably draw a vertical line from the min to max value within those 1000 samples in the waveform data. Thus, at each horizontal pixel, a vertical line will be provided in a display buffer to be shown to the user on a display.

Figure 1:
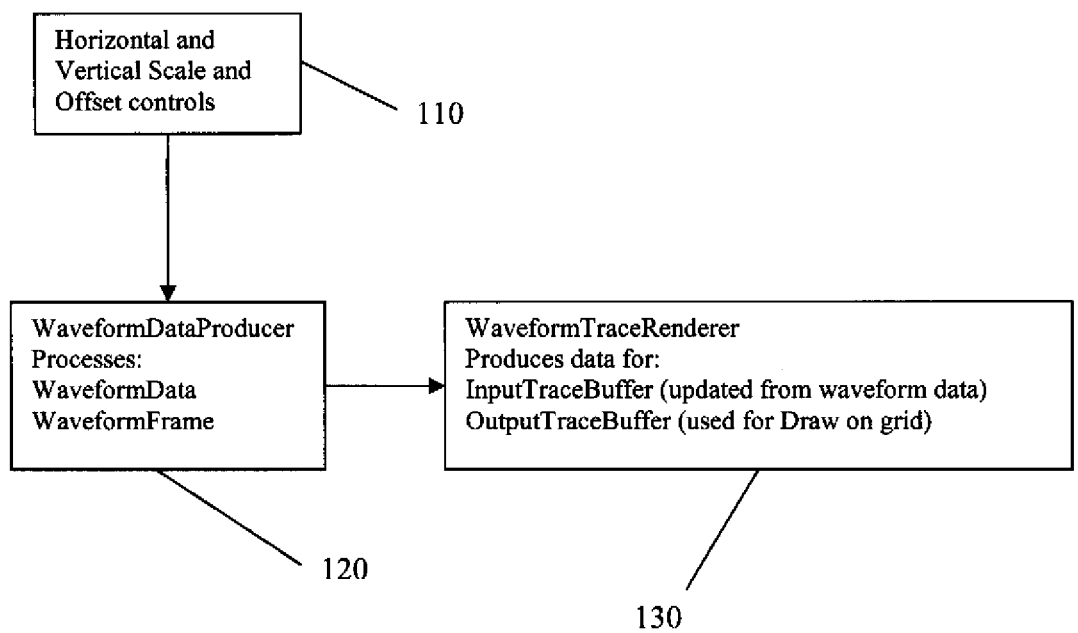
FIG. 1 is a flow chart diagram depicting conventional processing of updating display data in a digital oscilloscope.
Figure 2:
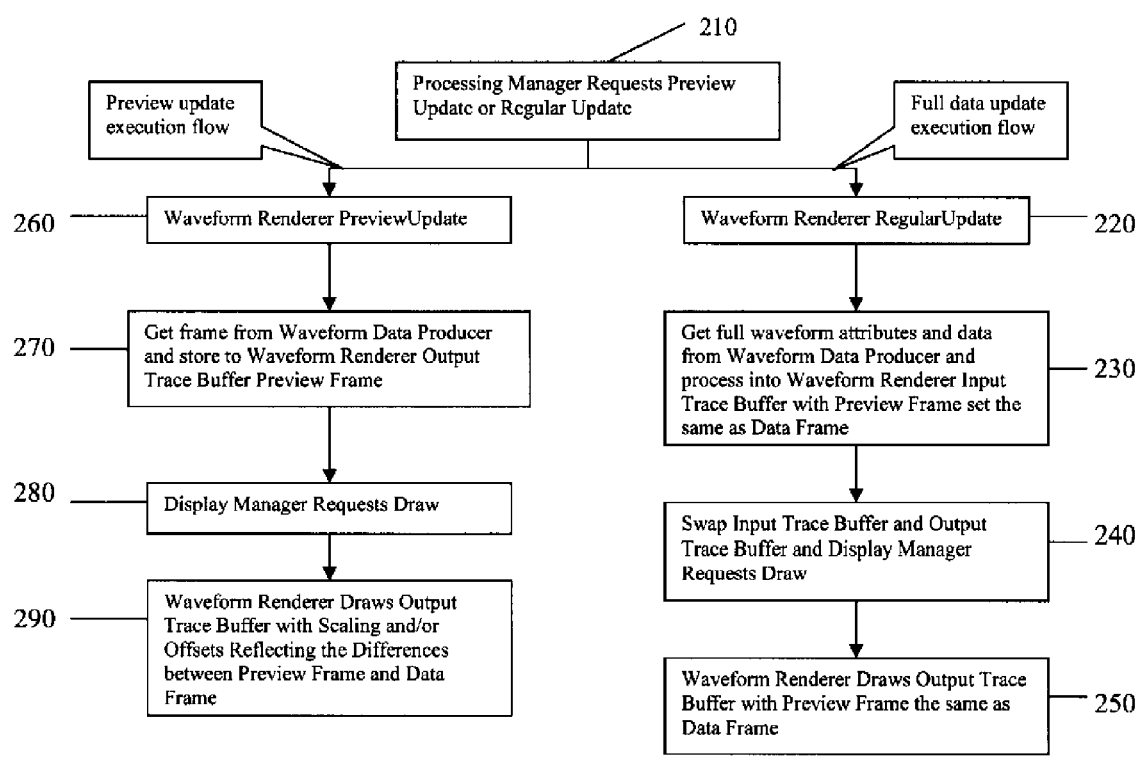
FIG. 2 is a flowchart diagram depicting processing of updating display data in a digital oscilloscope in accordance with the present invention.

Referring next to FIG. 2, the more general case of an implementation of the present invention will be described. As is shown in FIG. 2, at step 210, a determination is made whether to call a preview update or a regular update. Regular update is the process utilized when updating the display under normal operating conditions, i.e. when new data is being acquired, and the display is being updated to reflect this new data. When such regular update is selected at step 220, at step 230 the attributes of the data, and the data and frame are obtained from a waveform data producer. This information is further processed to generate display data that is stored to the waveform renderer input trace buffer. Thereafter, at step 240, the waveform renderer swaps the input and output trace buffers and a display manager requests an update of drawing the new information from the output trace buffer to the display. At step 250 the waveform renderer draws information to the display from the output trace buffer which has preview frame equal to the data frame, so that no rescaling or offset is necessary in the drawing operation However, each time this processing takes place, a substantial time delay may be involved for processing of the new data. As noted above, when a redrawing of the display is to take place upon changing one or more of the user-selected display parameters, this processing may result in sluggish performance of the apparatus. Therefore, in accordance with the invention, as is further shown in FIG. 2, if it is determined at step 210 that a preview update processing in response to a change is just such a display parameter, rather than implementing the processing noted above with respect to steps 220-250, processing will instead pass to a preview update procedure at step 260. At step 270, frame information is provided from the waveform data producer that is indicative of the user-selected parameters. No version of acquired data is provided. This information is stored to the waveform renderer output trace buffer preview frame. Then at step 280, the display manager requests an update of drawing the output trace buffer to the display. At step 290, the waveform renderer draws information to the display from the output trace buffer with rescaling and/or offsetting reflecting the differences between the preview frame and the data frame".

Thus, as each change of parameter results in essentially a resealing of the data that is included in a display buffer and is already written to the screen. Thus, even though the changed parameters are desired to apply to further acquisition data, they are applied to the information already displayed on the screen so that the user is able to view what such changes will look like on the display without having to wait for more processing of new data. Thereafter, when the timing requirements are not as critical, more regular processing (steps 220-250) can take place to provide the new data in accordance with the updated parameters.

Application of such processing to the trace including compacted vertical lines, by way of example only will be described. A preview update for this type of trace is implemented so that any vertical scale and/or offset changes are first applied by rescaling and/or offsetting all of the min/max values relative to the original scale and offset, using the displayed data from the display buffer. Horizontal scale and/or offset changes may also be applied by resealing and/or offsetting the bitmap image of the trace as displayed. Thus, it is possible, in accordance with the invention to implement such parameter changes without requiring complete processing of any new data.

Thus, the preview feature, as implemented in accordance with the present invention, preferably does not have any direct dependency or implementation based upon on the full waveform data. Such preview processing preferably does not attempt to access the full waveform data, because it may take a long time to update. The full waveform data may be updated after the preview is complete, or concurrently to the processing of the preview update as described in accordance with the invention.

Similar preview procedures may also be applied to other types of waveform traces; for example histogram compactions, persistence bitmaps, digital waveforms. These various waveform trace objects may be the produced by acquisition channels for which the horizontal and vertical scale and offset controls may include classic oscilloscope controls such as time per division, trigger delay, voltage per division, offset and the like. They may also be produced by math functions or other analysis and/or processing objects for which the horizontal scale and offset controls may be "zoom" controls.

Therefore, the principle of the invention can be expressed as a preview of a processing result in response to some control change can be calculated without requiring the full input processing results (e.g. waveforms). For some cases, these controls may be related to scaling or offset (as in the specific scenarios described previously). However, there may be other cases where the processing transformations are not a function of scaling but rather something else (e.g. FFT dependency on input waveform time per point). In accordance with the invention, a quickly computed preview may be provided as when controls are changed by the user without requiring access to or synchronization with the full processing result that may be concurrently or subsequently computed.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the description is intended to cover all of the generic and specific features of the invention herein described and all statements of the scope of the invention which, as a matter of language, might be said to fall there between.

What is claimed:

1. A method for displaying information on a data acquiring device, comprising the steps of:
    receiving an input data;
    generating a version of the received input data to be displayed in accordance with one or more display parameters;
    storing the version of the received input data generated in accordance with the one or more display parameters to a first waveform trace buffer;
    storing the generated version of the received input data to be displayed to a display buffer;
    displaying the generated version of the received input data from the display buffer;
    receiving a requested change in one or more display parameters;
    implementing the requested change of the one or more display parameters to the data in the display buffer;
    displaying the changed version of the data in the display buffer;
    processing further received input data in accordance with the requested change in the one or more display parameters;
    storing the further received and processed input data to a second waveform trace buffer; and
    updating the data in the display buffer in accordance with the stored further received and processed input data from the second waveform trace buffer.

2. The method of claim 1, wherein the step of implementing the requested change of the one or more display parameters on the displayed data further comprises the steps of:
    obtaining the displayed data from the display buffer;
    processing the obtained display data in accordance with the requested change in the one or more display parameters;
    providing the processed displayed data to the display buffer; and
    writing the processed display data from the display buffer to the display.

3. The method of claim 1, wherein the device acquiring data comprises an oscilloscope.

4. The method of claim 3, wherein the requested change in the one or more display parameters comprises a change in a displayed time per division on the display.

5. The method of claim 3, wherein the requested change in the one or more display parameters comprises a change in a trigger delay.

6. The method of claim 3, wherein the requested change in the one or more display parameters comprises a change in a voltage per division on the display.

7. The method of claim 3, wherein the requested change in the one or more display parameters comprises a change in an offset of the display.

8. The method of claim 3, wherein the requested change in the one or more display parameters is generated by an analysis tool.

9. The method of claim 8, wherein the requested change in the one or more display parameters comprises a change to one of horizontal scale and offset controls.

10. The method of claim 1, wherein the requested change in the one or more display parameters is requested as a function of one or more characteristics of the input data.

11. A method for displaying information on an oscilloscope, comprising the steps of:
    acquiring an input data stream;
    generating a version of the acquired input data to be displayed on a display of the oscilloscope in accordance with one or more display parameters;
    storing the version of the acquired input data generated in accordance with the one or more display parameters to a first waveform trace buffer;
    storing the to be displayed generated version of the acquired input data from the first waveform trace buffer to a display buffer;
    displaying the generated version of the received acquired data;
    receiving a requested change in one or more display parameters;
    implementing the requested change of the one or more display parameters on the data stored in the display buffer;
    displaying the changed data in the display buffer;
    processing further received input data in accordance with the requested change in the one or more display parameters;
    storing the further received and processed input data to a second waveform trace buffer; and
    updating the display buffer with the processed further received input data.

12. The method of claim 11, wherein the step of implementing the requested change of the one or more display parameters on the data stored in the display buffer further comprises the steps of:
    obtaining the displayed data from the display buffer;
    processing the obtained display data in accordance with the requested change in the one or more display parameters;
    providing the processed displayed data to the display buffer; and
    writing the processed display data from the display buffer to the display.

13. An oscilloscope for acquiring an input data stream, processing the input data stream, and displaying a version of the processed data stream on a display, the oscilloscope further comprising:
    an acquisition element for acquiring an input data stream;
    a waveform data producer for generating a version of the acquired input data to be displayed on a display of the oscilloscope in accordance with one or more display parameters;
    a first waveform trace buffer for storing a portion of the generated version of the acquired input data stream;
    a second waveform trace buffer for storing a portion of the acquired input data stream;
    a display buffer for storing the to be displayed version of the acquired input data;
    a display for displaying the generated version of the received acquired data in accordance with the display buffer; and
    a processor for receiving a requested change in one or more display parameters, implementing the requested change of the one or more display parameters on the data stored in the display buffer, processing the further received input data in accordance with the requested change in the one or more display parameters, and storing the processed further received input data to the second waveform trace buffer; and
    wherein the display is first updated with the updated data stored in the display buffer, and the display is later updated in accordance with the processed further received input data stored in the second waveform trace buffer.

14. The oscilloscope of claim 13, wherein the processor is further adapted to obtain the displayed data from the display buffer, process the obtained display data in accordance with the requested change in the one or more display parameters, provide the processed displayed data to the display buffer, and write the processed display data from the display buffer to the display when implementing the requested change of the one or more display parameters.

15. The oscilloscope of claim 13, wherein the requested change in the one or more display parameters comprises a change in a displayed time per division on the display.

16. The oscilloscope of claim 13, wherein the requested change in the one or more display parameters comprises a change in a trigger delay.

17. The oscilloscope of claim 13, wherein the requested change in the one or more display parameters comprises a change in a voltage per division on the display.

18. The oscilloscope of claim 13, wherein the requested change in the one or more display parameters comprises a change in an offset of the display.

19. The oscilloscope of claim 13, wherein the requested change in the one or more display parameters is generated by an analysis tool.

20. The oscilloscope of claim 19, wherein the requested change in the one or more display parameters comprises a change to one of horizontal scale and offset controls.

21. The oscilloscope of claim 13, wherein the requested change in the one or more display parameters is requested as a function of one or more characteristics of the input data.

\* \* \* \* \*